United States Patent [19]

Watanabe et al.

[11] Patent Number: 4,639,795
[45] Date of Patent: Jan. 27, 1987

[54] SIGNAL TRANSMISSION CIRCUIT

[75] Inventors: Kazuo Watanabe; Tetsuo Sato, both of Takasaki, Japan

[73] Assignee: Hitachi, Ltd., Tokyo, Japan

[21] Appl. No.: 841,830

[22] Filed: Mar. 20, 1986

Related U.S. Application Data

[62] Division of Ser. No. 578,786, Feb. 10, 1984, abandoned.

[30] Foreign Application Priority Data

Mar. 25, 1983 [JP] Japan ................. 58-48825

[51] Int. Cl.⁴ ................. G11B 15/12; G11B 5/02
[52] U.S. Cl. ................. 360/62; 360/61; 360/68
[58] Field of Search ................. 360/61, 62, 65, 66, 360/68, 67

[56] References Cited

U.S. PATENT DOCUMENTS 4,354,209 10/1982 Sato et al. ................. 360/67
4,476,502 10/1984 Watanabe ................. 360/65

Primary Examiner—Vincent P. Canney
Attorney, Agent, or Firm—Antonelli, Terry & Wands

[57] ABSTRACT

A signal transmission circuit includes a switched capacitor and a control circuit. The switched capacitor includes a capacitor and a plurality of switching means. The control circuit controls the frequency or level of a control signal to be applied to the switching means of the switched capacitor. By varying the frequency of the control signal with the control circuit, the equivalent resistance of the switched capacitor can be varied. By controlling the level of the control signal with the control circuit, at least one of the plurality of switching means is held in the "off" state thereof, to substantially inhibit the signal transmission of the switched capacitor.

2 Claims, 7 Drawing Figures

4,639,795

SIGNAL TRANSMISSION CIRCUIT

This is a division of application Ser. No. 578,786, filed Feb. 10, 1984 now abandoned.

BACKGROUND OF THE INVENTION

The present invention relates to a signal transmission circuit which is well suited for application to audio equipment, and the like.

Variable impedance circuits, such as signal transmission circuits in which the impedance of a signal transmission path is varied by a current control, have been known from U.S. Pat. Nos. 3,761,741 and 4,220,875. Prior to the present invention, we have studied the known variable impedance circuits. As a result of these studies, it has been found that the current consumption in these circuits increases sharply when the impedance is varied to a small value. That is, we have found that the current consumption increases in inverse proportion to the impedance.

On the other hand, a switched capacitor filter, which is a sampled value filter, has received quick acceptance for use as a monolithic filter in recent years, as reported in Proceedings of IEEE 67. 10. page 1403, October, 1979, "Application of CCD and Switched Capacitor Filter Technology" by Hewes et al. In a switched capacitor filter, an impedance is equivalently formed by the capacitance of a capacitor and the frequency of a clock signal applied to switching means connected to the capacitor.

SUMMARY OF THE INVENTION

An object of the present invention is to provide a signal transmission circuit of low current consumption.

In a typical application of the present invention, a signal transmission circuit is provided which includes a switched capacitor arrangement formed by a capacitor and switching means connected thereto, and especially includes a control circuit which controls the frequency or the level of a control signal to be applied to the switching means of the switched capacitor.

PREFERRED EMBODIMENTS OF THE INVENTION

Figure 1:
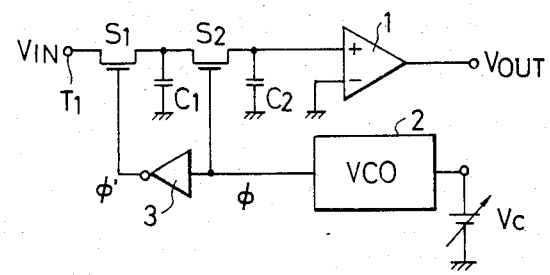
FIG. 1 is a circuit diagram of a signal transmission circuit showing a first embodiment of the present invention.

Embodiments of the present invention will now be described in detail with reference to the drawings.

Embodiment 1

Now, a first embodiment of a variable impedance circuit for use as a signal transmission circuit to which the present invention is applied will be described with reference to FIG. 1.

An SCF (Switched Capacitor Filter) is incorporated between an input terminal $T_1$ and the non-inverting input terminal of an operational amplifier 1. The SCF is composed of switches $S_1$, $S_2$ and capacitors $C_1$, $C_2$. The changeover of the switches $S_1$ and $S_2$ into "on" states or "off" states is effected by the output signal $\phi$ of a voltage-controlled oscillator 2 (hereinbelow, abbreviated to "VCO") and the output signal $\phi'$ of an inverter 3. A variable voltage $V_C$ serves to control the output signal $\phi$ of the VCO2 to a desired frequency.

Assuming now that the switch $S_2$ is "off" in accordance with the output signal $\phi$, the switch $S_1$ operates in the "on" state in accordance with the phase-inverted output signal $\phi'$ which is provided from the inverter 3. An input signal $V_{IN}$ is transmitted to the capacitor $C_1$ through the switch $S_1$ to charge the capacitor $C_1$. In contrast, when the output signal $\phi$ has its phase inverted, the switch $S_2$ is changed over to the "on" state. Simultaneously therewith, the output signal $\phi'$ of the inverter 3 has its phase inverted to bring the switch $S_1$ into the "off" state. That is, the charging current which has been flowing to the capacitor $C_1$ through the switch $S_1$ is cut off. Charges stored in the capacitor $C_1$ are supplied to the capacitor $C_2$ through the switch $S_2$. Thus, the charges are moved from the capacitor $C_1$ to the capacitor $C_2$. Herein, a voltage which is determined by the charged potential of the capacitor $C_2$ becomes the input voltage of the operational amplifier 1.

The circuit operation described above is seen to be equivalent to the case where current which is to flow to the capacitor $C_2$ is supplied through an impedance. More specifically, at a time $t = nT_c$, where $T_c$ denotes the period of the output signals $\phi$ and $\phi'$ originating from the VOC2 and n denotes an arbitrary number, the charge stored in the capacitor $C_1$ is expressed by $C_1 V_{in}(nT_c)$, assuming that the switch $S_1$ is "on" and the switch $S_2$ is "off". At this time, since the voltage of the capacitor $C_2$ corresponds to the previous half cycle, the charge stored in the capacitor $C_2$ is expressed by $C_2 V_{in}[(n-\frac{1}{2})T_c]$.

Subsequently, when the switch $S_1$ has changed over from "on" to "off" and the switch $S_2$ has changed over from "off" to "on", the charge of the capacitor $C_1$ moves to the capacitor $C_2$. Accordingly, the charge of the capacitor $C_2$ at a time $t = (n+\frac{1}{2})T_c$ become as follows, in accordance with the law of conservation of charges:

$$C_2 V_{OUT}[(n+\tfrac{1}{2})T_c] = C_2 V_{OUT}[(n-\tfrac{1}{2})T_c] - C_1 V_{in}(nT_c) \tag{1}$$

Thus, a transfer function $H_{\frac{1}{2}}(Z)$ in the corresponding half cycle becomes as follows:

$$H_{\frac{1}{2}}(Z) = -\frac{C_1}{C_2} \cdot \frac{Z^{-\frac{1}{2}}}{1 - Z^{-1}} \tag{2}$$

where $Z^{-\frac{1}{2}}$ indicates a delay corresponding to a half cycle.

In the next half cycle from the time $t=(n+\frac{1}{2})T_c$ to a time $t=(n+1)T_c$, merely a delay corresponding to a half cycle arises while the output voltage $V_{OUT}$ is held. Therefore, the transfer function $H_1(Z)$ of the whole cycle becomes as follows:

$$H_1(Z) = -\frac{C_1}{C_2} \cdot \frac{Z^{-1}}{1-Z^{-1}} \quad (3)$$

Assuming that a frequency $f_c$ corresponding to the period $T_c$ of the output signals $\phi$ and $\phi'$ from the VCO2 is very high, $Z=e^{sT_c}\approx 1+sT_c$ holds. Accordingly, equation (3) becomes as follows:

$$H_1(Z)\approx C_1/(sC_2T_c) \quad (4)$$

This signifies that the resistance R of the transfer function $H(s)=1/(sCR)$ of a CR integrator circuit is equivalently formed by the value $T_c/C_1$ of the switched capacitor.

Therefore, the variable impedance circuit in the present embodiment has the frequency $f_c$ and period $T_c$ of the output signal $\phi$ controlled by adjusting the voltage level of the control voltage $V_c$. In consequence, the equivalent resistance $T_c/C_1$ of the signal transmission circuit extending from the input terminal $T_1$ to the non-inverting input terminal of the operational amplifier 1 is controlled. Accordingly, the equivalent resistance $T_c/C_1$ and capacitor $C_2$ of the switched capacitor determine a frequency characteristic, which can be controlled by the frequency $f_c$ and period $T_c$ of the output signals $\phi$ and $\phi'$ from the VCO2.

Semiconductor switching elements such as MOSFETs can be utilized as the switching means $S_1$ and $S_2$, and the VCO2 can be replaced with a current-controlled oscillator.

Embodiments 2 and 3

Next, as a second embodiment of the present invention, an example of application of the variable impedance circuit explained as the first embodiment will be described with reference to FIG. 2.

A signal $e_1$ produced from a signal source is supplied to an amplifier 11 and a level detector 12. The level detector 12 may be a rectifying circuit by way of example. The frequency $f_c$ of the output signal $\phi$ to be provided from the VCO2 is varied in correspondence with the control voltage $V_c$ derived from the level detector 12. The switches $S_1$ and $S_2$ are alternately changed over into the "on" and "off" states by the output signals $\phi$ and $\phi'$. In relation to a signal $e'$ amplified by the amplifier 11, the switches $S_1$, $S_2$ and the capacitors $C_1$, $C_2$ operate similarly to those in the case of the first embodiment. The charged voltage level of the capacitor $C_2$ becomes an input signal to an amplifier 13, and an output signal $V_{out}$ is provided from a terminal $T_2$.

Figure 3:
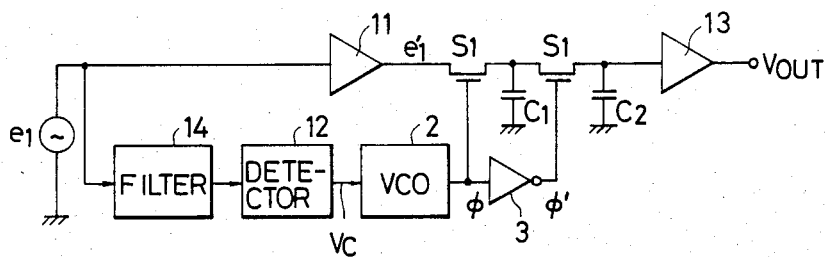
FIG. 3 is a circuit diagram of a signal transmission circuit showing a third embodiment of the present invention.

In the second embodiment described above, the resistance of the transmission path of the signal $e_1$, in other words the gain and frequency characteristic thereof, is varied by the voltage level of the signal $e_1$, not by the frequency thereof. The gain of the transmission path can also be varied by the voltage level and the frequency by inserting a filter circuit of various characteristics 14 in the control loop as shown in FIG. 3, which is illustrative of a third embodiment. This is well suited, for example, to the noise reduction system of a tape recorder.

Embodiment 4

Next, a fourth embodiment of the present invention will be described with reference to FIG. 4.

Figure 2:
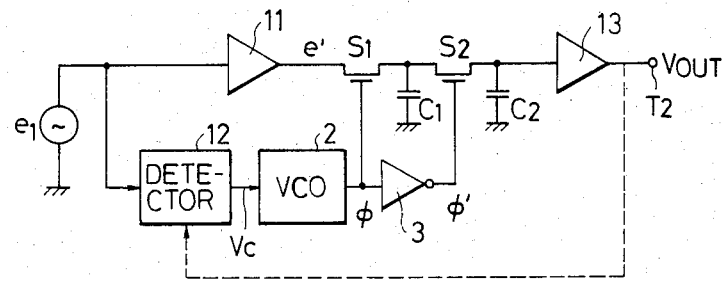
FIG. 2 is a circuit diagram of a signal transmission circuit showing a second embodiment of the present invention.
Figure 4:
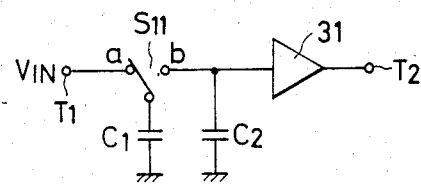
FIG. 4 is a circuit diagram of a signal transmission circuit showing a fourth embodiment of the present invention.

The switches $S_1$ and $S_2$ shown in FIGS. 1, 2 and 3 can be equivalently expressed by switching means $S_{11}$, as illustrated in FIG. 4. That is, the operations of the switches $S_1$ and $S_2$ can be represented by the switching means $S_{11}$, which is changed over to the sides of contacts a and b by the signals $\phi$ and $\phi'$ as described in each of the foregoing embodiments.

In this case, a low-pass filter of $\tau = \phi(C_2/C_1)$ is formed. However, when the switching means $S_{11}$ is held in contact with the contact a, as depicted in FIG. 4; in other words, when the switch $S_1$ is "on" and $S_2$ is "off" in FIGS. 1 to 3, the impedance between the contacts a and b become infinity, and the contact a is grounded through the capacitor $C_1$. Accordingly, the input signal $V_{IN}$ is not transmitted to the capacitor $C_2$ and the amplifier 31. When the switching means $S_{11}$ is changed over and held in contact with the contact b, the switch $S_1$ is "off" and the switch $S_2$ is "on", and hence, the input signal $V_{IN}$ is not transmitted to the amplifier 31 also in this case.

These circuits can be utilized, for example, as the NR (noise reduction) on-off switches of a noise reduction system. In this case, a separate NR on-off switch need not be provided since on-off control can be accomplished, merely by stopping the clock, so that the circuit arrangement is simplified. In this system, since the voltage charge on the capacitor $C_2$ immediately before the stopping of the clock remains immediately after the same, the input signal of the amplifier 31 does not change suddenly.

Embodiment 5

Figure 5:
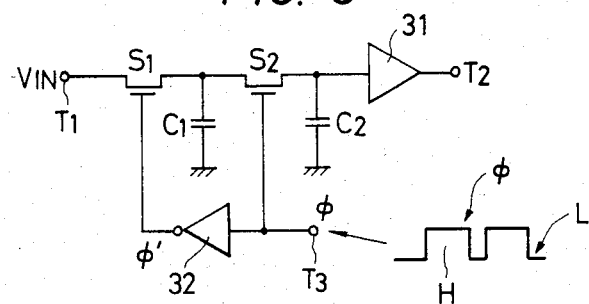
FIG. 5 is a circuit diagram of a signal transmission circuit showing a fifth embodiment of the present invention.

Next, a fifth embodiment of the present invention will be described with reference to FIG. 5.

A control terminal $T_3$ is supplied with a control signal $\phi$ whose duty ratio is variable. As is well known, the duty ratio of the control signal $\phi$ signifies the ratio between the period of the high level "H" and that of the low level "L" of the control signal $\phi$. A circuit such as a monostable multivibrator for generating the control signal $\phi$ having a variable duty ratio, though not shown in FIG. 5, has its output connected to terminal $T_3$. In this case, the switches $S_1$ and $S_2$ are alternately changed over into "on" and "off" states in the manner already described for other embodiments. However, even when the frequency of the signal $\phi$ is constant, the charging time of capacitor $C_1$ can be made long and the discharging time thereof short by varying the duty ratio of the signal $\phi$. Alternatively, it is possible to make the charging time short and the discharging time long. In case of employing a switched capacitor as a variable impedance, accordingly, the frequency and/or the duty ratio of the clock pulses may be controlled.

Embodiment 6

Figure 6:
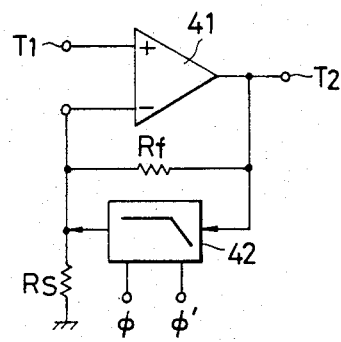
FIG. 6 is a circuit diagram of an amplifier circuit showing a sixth embodiment of the present invention.

Next, a sixth embodiment of the present invention will be described with reference to FIG. 6.

In this embodiment, an amplifier 41 is constructed in the form of an operational amplifier, and a switched capacitor filter (SCF) 42 is formed of switches $S_1$, $S_2$ and capacitors $C_1$, $C_2$ as shown in FIG. 1. The SCF 42 has either or both of the switches $S_1$ and $S_2$ changed over into their "off" states by control signals φ and φ'. A control signal generator circuit for generating the control signals φ and φ' and a control circuit are also provided in the manner previously described, though not shown in FIG. 6.

When the output signal of the control circuit has become a predetermined level, one of the control signals φ and φ' to be delivered from the control signal generator circuit is forcibly held at its high level, and the other is forcibly held at its low level, whereby the signal transmitting function of the switched capacitor filter 42 is forcibly inhibited. In this case, the SCF 42 is electrically disconnected between the output terminal and inverting input terminal of the amplifier 41. Accordingly, the amplification factor of the amplifier is determined by the ratio between feedback resistances $R_2$ and $R_f$, and it exhibits a substantially flat frequency characteristic.

In contrast, in a case where the SCF 42 operates normally, the circuit between terminals $T_1$ and $T_2$ becomes an amplifier circuit which has an amplification factor dependent upon the frequency characteristic of the SCF 42. In this manner, according to the present invention, the closed loop amplification factor of the amplifier can be controlled at will by controlling the operation of the SCF incorporated in the feedback loop of the amplifier.

Embodiment 7

Figure 7:
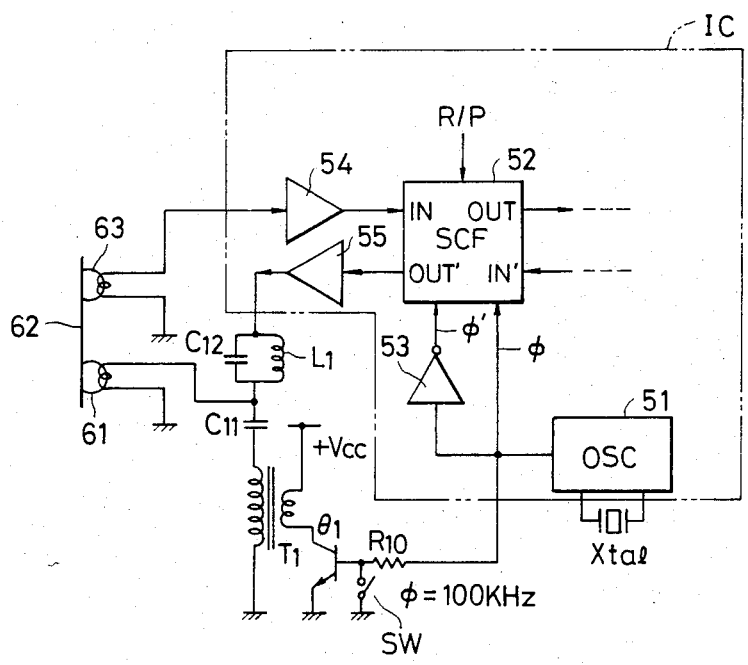
FIG. 7 is a circuit diagram of the essential portions of a tape recorder showing a seventh embodiment of the present invention.

Next, a seventh embodiment of the present invention will be described with reference to FIG. 7. This figure shows an example of a tape recorder which employs a switched capacitor filter (SCF).

A recorded signal on a magnetic tape 62 is detected by a playback head 63 and is amplified by a playback amplifier 54, whereupon the amplified signal is applied to the first input terminal IN of an SCF 52. A signal path extending between the first input terminal IN and first output terminal OUT of the SCF 52 functions as a NABB playback equalizer, which attenuates signal components of high frequencies. An output signal from the first output terminal OUT of the SCF 52 is supplied to a speaker through a playback power amplifier.

A signal from, e.g., a microphone, is transmitted to the input terminal of a recording amplifier 55 through a signal path which extends between the second input terminal IN' and second output terminal OUT' of the SCF 52. This signal path between the second input terminal IN' and second output terminal OUT' of the SCF 52 functions as a recording equalizer for compensating the high frequency losses of the magnetic tape 62 and heads 61, 63. An output signal from the recording amplifier 55 is transmitted to the recording head 61 through a resonance circuit which consists of a coil $L_1$ and a capacitor $C_{12}$.

A crystal oscillator 51 and an inverter 53 are provided for generating control signals φ and φ' of opposite phases to be impressed on switching means included within the SCF 52, in the manner already described.

When a recording/playback changeover signal R/P has reached its high level, the signal path between the first input terminal IN and first output terminal OUT of the SCF 52 is cut off, while when the recording/playback changeover signal R/P has reached its low level, the signal path between the second input terminal IN' and second output terminal OUT' of the SCF 52 is cut off.

A transistor $Q_1$ and a boosting transformer $T_1$ are similarly driven by the control signal φ of 100 kHz produced from the crystal oscillator 51, whereby an A.C. bias signal of 100 kHz is applied to the magnetic tape 62 in the recording mode. Meanwhile, in the SCF 52, the control signals φ and φ' leak to the outputs OUT and OUT' through the stray capacitances of the switching means constituting the SCF. If the difference frequency between the frequency of the control signals φ, φ' and that of the A.C. bias signal exists within the audio-frequency band, it will form a "beat offensive to the ear" to hamper the playback operation of the tape recorder. Since, however, both the frequency of the control signals φ, φ' and that of the A.C. bias signal are 100 kHz in the present embodiment, the difference frequency becomes null, and this disadvantage can be avoided.

As a modified embodiment, the frequency of the control signals φ, φ' to be applied to the SCF 52 is set at m×φkHz (m: positive integer), the frequency of the A.C. bias signal is set at n×100 kHz (n: positive integer), and the difference frequency is accordingly set at (m−n)×100 kHz outside the audio frequency band, whereby an audible beat interference can be prevented from arising.

The resonance circuit composed of the coil $L_1$ and the capacitor $C_{12}$ is a bias trap circuit resonant to 100 kHz, and it inhibits the A.C. bias signal of the booster $T_1$ from being transmitted to the output of the recording amplifier 55. In addition, the transistor $Q_1$ can be controlled into a non-conductive state in the playback mode by turning "on" a switch SW which is disposed across the base and emitter of the transistor $Q_1$. In the playback mode, therefore, the generation of the unnecessary A.C. bias signal can be stopped.

The signal transmission circuit of the present invention is not restricted to the foregoing embodiments. It is applicable, for example, to various types of magnetic recording and playback apparatuses, such as tape decks and VTRs. The present invention can be applied to general electronic equipment which employ, at least, a switched capacitor.

What is claimed is:

1. A magnetic recording and playback apparatus, comprising
   means including a playback amplifier for detecting a signal recorded on a magnetic tape;
   a first switched capacitor circuit having an input connected to the output of said playback amplifier;
   means including a recording amplifier for recording signals on a magnetic tape;
   a second switched capacitor circuit having an output connected to the input of said recording amplifier;
   control means including an oscillator circuit for generating control signals for controlling the operation of said first and second switched capacitor circuits; and
   means connected to the output of said recording amplifier for generating an A.C. bias signal for said magnetic tape, wherein the difference frequency between the frequency of the control signals generated by said control means and the frequency of said A.C. bias signal is either zero or falls outside of the audio frequency band.

2. A magnetic recording and playback apparatus according to claim 1, wherein the frequency of said A.C. bias signal is approximately 100 kHz.

* * * * *